United States Patent [19]

Matsuda et al.

[11] 4,121,936

[45] Oct. 24, 1978

[54] POSITIVE RESIST FOR HIGH ENERGY RADIATION

[75] Inventors: Shunsuke Matsuda; Soji Tsuchiya; Masami Honma, all of Kawasaki; Gentaro Nagamatsu, Tokyo, all of Japan

[73] Assignees: Matsushita Electric Industrial Co., Inc., Osaka; Fuji Chemicals Industrial Co. Ltd., Tokyo, both of Japan

[21] Appl. No.: 805,907

[22] Filed: Jun. 13, 1977

[30] Foreign Application Priority Data

Jun. 16, 1976 [JP] Japan ................................ 51-71536

[51] Int. Cl.$^2$ ................................................ G03C 1/68
[52] U.S. Cl. ................................ 96/35.1; 96/115 R; 204/159.19
[58] Field of Search ................ 96/35.1, 115 R, 115 P; 204/159.19, 159.16; 427/327 R

[56] References Cited

U.S. PATENT DOCUMENTS 3,964,908   6/1976   Bargon et al. ........................ 96/35.1

*Primary Examiner*—John D. Welsh
*Attorney, Agent, or Firm*—Stevens, Davis, Miller & Mosher

[57] ABSTRACT

A film of poly(methacrylamide) is heated to partially form imide bonds with elimination of ammonia, and such imide bonding causes crosslinking in the polymer to form a crosslinked polymer film. This film can be advantageously adapted as a positive resist capable of forming a positive image by exposure to radiation such as electron beams. The minimum incident charge required for such exposure is of the order of $10^{-7}$ coulomb/cm$^2$, which is far lower than the level required in the use of conventional resists. The resist provided according to this invention is also capable of forming an excellent heat-resistant positive resist image by short-time exposure to radiation.

24 Claims, 7 Drawing Figures

CHANGE OF C/N RATIO OF PMAA BY HEATING IN THE SOLUTION

FIG. 7

POSITIVE RESIST FOR HIGH ENERGY RADIATION

BACKGROUND OF THE INVENTION

This invention relates to a resist material for forming a resist pattern by application of radiation such as electron beams, X-rays and ultraviolet rays.

Many attempts have been made for increasing the integration scale of semiconductor integrated circuits in recent years, and as one of the significant outcomes of such attempts, there has been proposed a so-called etching method according to which method a fine and minute pattern can be obtained on the substrate by utilizing radiation with short wave length such as electron beams, X-rays and ultraviolet rays.

This invention is to provide a resist material for use in such etching method utilizing the above-said types of radiation. The resist material provided according to this invention is of the positive type which is solubilized in the developing solvent by application of said radiation.

Poly(methylmethacrylate) (hereinafter referred to as PMMA), crosslinked PMMA and poly(styrene sulfone) are known as typical examples of the conventional positive type resist materials, but all of these materials are unsatisfactory in respect of sensitivity. For example, the minimum required incident charge of electron beams is as high as $5 \times 10^{-5} C/cm^2$ in the case of PMMA, $0.8 \times 10^{-5} C/cm^2$ in the case of crosslinked PMMA, and $1 \times 10^{-5} C/cm^2$ in the case of poly(styrene sulfone), and for drawing, for example, a 3-inch square mask pattern, it is necessary to apply fairly intense electron beams for a prolonged period of time which would amount to the order of days.

Use of a polymer of poly(dimethacryl imide) or a copolymer thereof with a vinyl monomer as a positive resist material has been proposed recently (U.S. Pat. No. 3,964,908). The resist material provided according to this proposal is composed of a polymer having the following structural unit:

with the C/N atomic ratio of 8, or a copolymer consisting of said polymer and a vinyl monomer such as styrene or methacrylic acid ester. However, in this proposal, too, a fairly high electron beam incident charge, on the order of $10^{-5}$ coulomb/$cm^2$, is required for forming an image. This level of incident charge is only slightly better than those required for the conventional PMMA resists.

The primary object of this invention is to provide a resist material having sensitivity to the electron beams with an incident charge of a level which is one to two figures lower than that required for the conventional resist materials.

Another object of this invention is to provide a resist film having high heat stability sufficient to withstand ion beam etching.

The resist provided according to the present invention is composed principally of polymethacrylamide (hereinafter referred to as PMAA) or a copolymer thereof and has a sensitivity to electron beam irradiation of the minimum incident charge of $2 \times 10^{-7}$ C/$cm^2$. This resist requires short-time irradiation and has excellent thermal stability to well withstand ion beam etching.

SUMMARY OF THE INVENTION

According to the present invention, there is provided a resist material capable of forming a positive image by the application of radiation, said resist material being composed of a crosslinked polymer comprising the following structural units:

(I)

(II)          (III)

where the C/N atomic ratio is more than 4 and up to 6, or a copolymer consisting of said polymer and another vinyl monomer, said copolymer containing the units of said vinyl monomer additively in an amount of up to 10 mol%.

The resist material of this invention can be produced by heating poly(methacrylamide) or a copolymer thereof with other vinyl monomer (such copolymer being hereinafter referred to as PMAA copolymer) to partially form imide bonds. The imide-bonded portion eliminates ammonia and resultantly forms the above-shown structural units (I) and (II), and PMAA is made into the resist material of this invention having a crosslinked structure and being sparingly soluble in water (such material being hereinafter referred to as imide-formed PMAA or imide-formed PMAA copolymer). PMAA and its copolymers usable in this inventin are already known in the art and disclosed, for example, in Rohm & Hass, Co.: "Methacrylamide" (1955).

As examples of vinyl monomers which can be copolymerized with methacrylamide for forming a PMAA copolymer used in this invention, one may cite the following: acrolein, acrylonitrile, methacrylic acid, lower alkyl esters of acrylic acid, lower alkyl esters of methacrylic acid, acrylamide, barium or lead salts of acrylic acid, vinyl isothiocyanate and styrene. It is desirable that the copolymerization rate of said vinyl monomer in the PMAA copolymer be lower than 10 mol% based on methacrylamide. PMAA's and copolymers thereof used in this invention are those whose average molecular weight is over 50,000 at which level film formation is possible, but it should be noted that no satisfactory film is obtained if the average molecular weight is over 5,000,000. It is therefore desirable to use a material whose average molecular weight is between 50,000 and 5,000,000. It is also desirable that the molecular weight distribution be limited to a narrow range for obtaining high resolution.

The resist material of this invention is practically used as a coating film on a resist substrate such as semiconductor or metal plate. Such resist film may be formed either by directly heating the film of PMAA polymer or copolymer on the substrate or by first preparing an aqueous solution of imide-formed PMAA by heating an aqueous solution of said polymer and then applying such solution on the substrate.

Now the process of making a positive resist according to this invention, including the step of forming a positive image from the imide-formed PMAA film, will be described in detail with reference to the accompanying drawings by taking as an example the case where PMAA was used as starting material.

DESCRIPTION OF THE PREFERRED EMBODIMENTS

The first step in the process of this invention is to form a film 2 of an imide-formed PMAA on the surface of the substrate 1 to be etched which may be made of a semiconductor, a metal or a metal oxide. For forming such film 2, there is first prepared a 1 to 20% by weight solution of PMAA by using a solvent which is preferably of the type having a boiling point of over 70° C. The solvents with a boiling point of below 70° C. dry too quickly to obtain a good film. Usually, PMAA is almost insoluble in cold and warm water but soluble in hot water with a temperature of over 90° C. Once dissolved in a large volume of hot water, PMAA remains dissolved even if the solution is cooled. Therefore, it is desirable to evaporate water in the solution to obtain a solution with a desired concentration. When the solution concentration becomes higher than 20% by weight, the viscosity of the solution exceeds 100 cP to make it hard to form a desired film. On the other hand, if the concentration is lower than 1% by weight, it is hardly possible to obtain a film with a desired thickness. The substrate 1 is coated with a 1 to 20% by weight, preferably 6 to 10% by weight aqueous solution of PMAA by a suitable method such as for example spin-coating and the coating is dried to form a film of PMAA on the substrate. The film-formed substrate is then subjected to a heat treatment (hereinafter referred to as prebaking) so as to enhance adhesiion between the substrate 1 and the PMAA film and to induce partial imide conversion in the PMAA film. This heat treatment eliminates water remaining in the film to enhance adhesion of the film to the substrate and expedite the partial imide conversion reaction of the PMAA, thereby producing an imide-formed PMAA film 2, or the resist material of the present invention. The imide conversion reaction may be induced by heating the PMAA solution. It is therefore possible to apply a PMAA solution where partially imide conversion has been previously effected. Use of such solution makes it possible to complete, in a short time, the heat treatment which is performed just before exposure to radiation.

Figure 6:
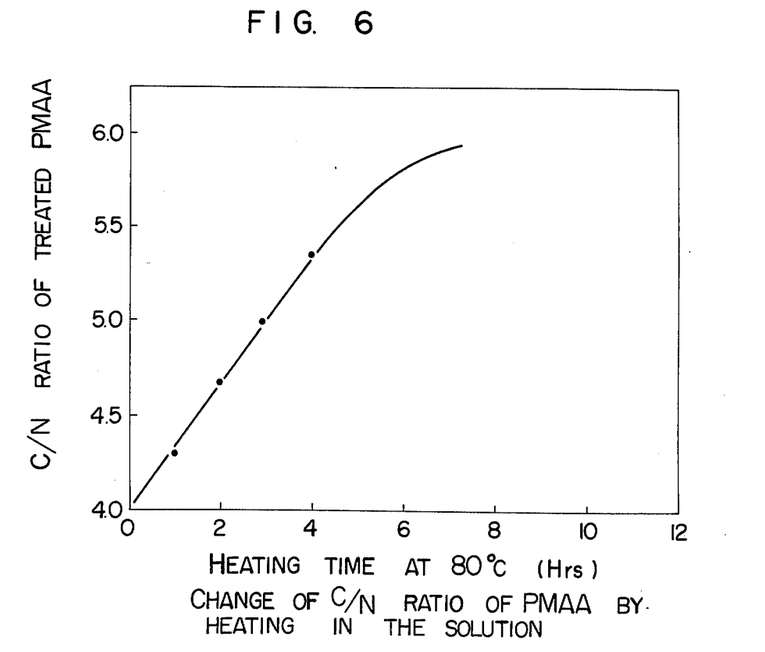
FIG. 6 shows the mode of progress of the imide conversion reaction in a case where an aqueous solution of a PMAA polymer was heated.

The imide conversion reaction in an aqueous solution is accomplished by heating the solution at a temperature of from about 70° C. to about 100° C. FIG. 6 shows the change of C/N ratio of PMAA when a 7% by weight aqueous solution of PMAA was heated at 80° C. When the C/N ratio exceeds 5.5, the PMAA solution exhibits a tendency to be gelled, so that it is essential for maintaining the homogenous solution to adjust the C/N ratio of PMAA so as not to exceed 5.5. The viscosity-average molecular weight of PMAA under such condition is 250,000. When the solution of PMAA with its C/N ratio adjusted to 5.5 is applied to the substrate and the coating is heated at 225° C. for 30 minutes, the C/N ratio can be raised to 6.0.

Control of the degree of advancement of the imide conversion reaction is important. If the reaction advances too much, there results insufficient scission of the polymer in the irradiated portion so as to make the polymer hard to dissolve in the developing solution, while if the reaction fails to advance to a required condition, the non-irradiated portion becomes liable to swell or strip off upon contact with the developing solution. In either case, no satisfactory image can be formed. The most appropriate degree of imide conversion reaction, if expressed in terms of C/N ratio of the polymer, is within the range of more than 4 and up to 6, preferably 4.09 to 6.0.

Figure 2:
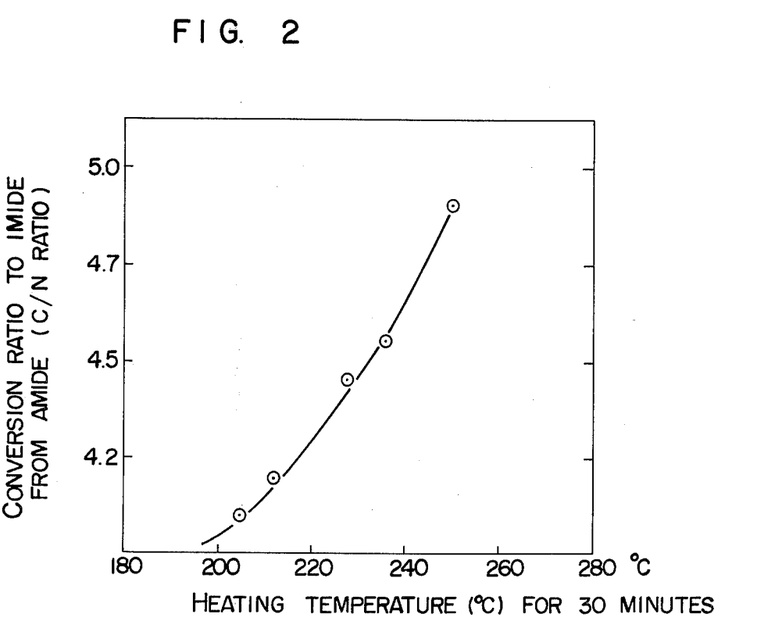
FIG. 2 shows the progress (change of C/N ratio) of the imide conversion reaction in a case where a film of PMAA polymer was heated.
Figure 3:
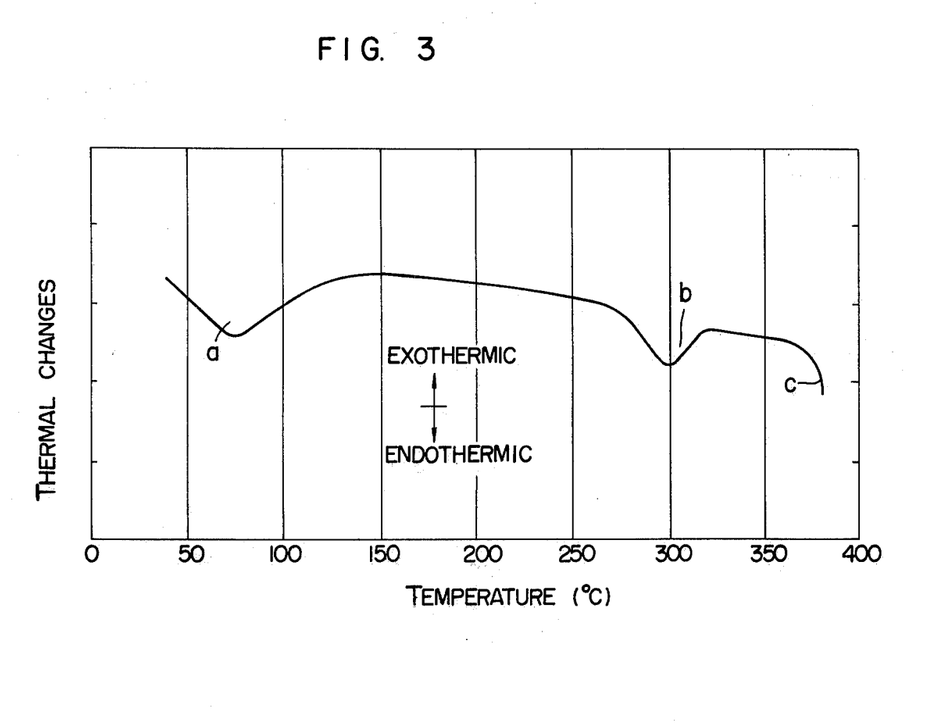
FIG. 3 shows the process of the reaction in a case where the PMAA polymer was heated at heating rate of 10° C./min.

The imide conversion reaction on the substrate can be accomplished by heating PMAA. FIG. 2 exemplifies the relationship between heating temperature and conversion ratio from amide to imide (C/N ratio). It will be noted that the imide conversion to the desired C/N ratio by, for example, 30-minute heating requires heating at a temperature of from 180° to 270° C. FIG. 3 shows the relationship between the imide conversion reaction and heating conditions by way of the exothermic-endothermic reaction process as determined by using a differential scanning colorimeter. The imide conversion reaction is an endothermic reaction which proceeds as follows. When the PMAA film is heated to 70° to 80° C., water contained in the PMAA is evaporated (endothermic change) (see $a$ in FIG. 3), and the imide conversion reaction takes place with elimination of ammonia at a temperature of around 150° C. and the reaction is completed abruptly at around 300° C. (see $b$ in FIG. 3). PMAA is decomposed when the temperature exceeds 370° C. (see $c$ in FIG. 3). Thus, partial imide conversion of PMAA occurs when the PMAA film is heated to a temperature of 180° to 270° C.

The reaction can be also traced by conducting elemental analysis of the reaction product at suitable time intervals. Suppose that PMAA were heated at 250° C. for 3 hours, then the elemental analysis of the reaction product shows that PMAA has changed from the general formula: $(C_4NOH_7)_n$ (where $n$ represents the polymerization degree) to the general formula: $[(C_4NOH_7)_{0.38}(C_8NO_2H_{11})_{0.31}]_n$ (where $n$ represents the same as defined above). It is learned from this that the C/N ratio of PMAA has changed from 4 to 5.8.

Figure 7:
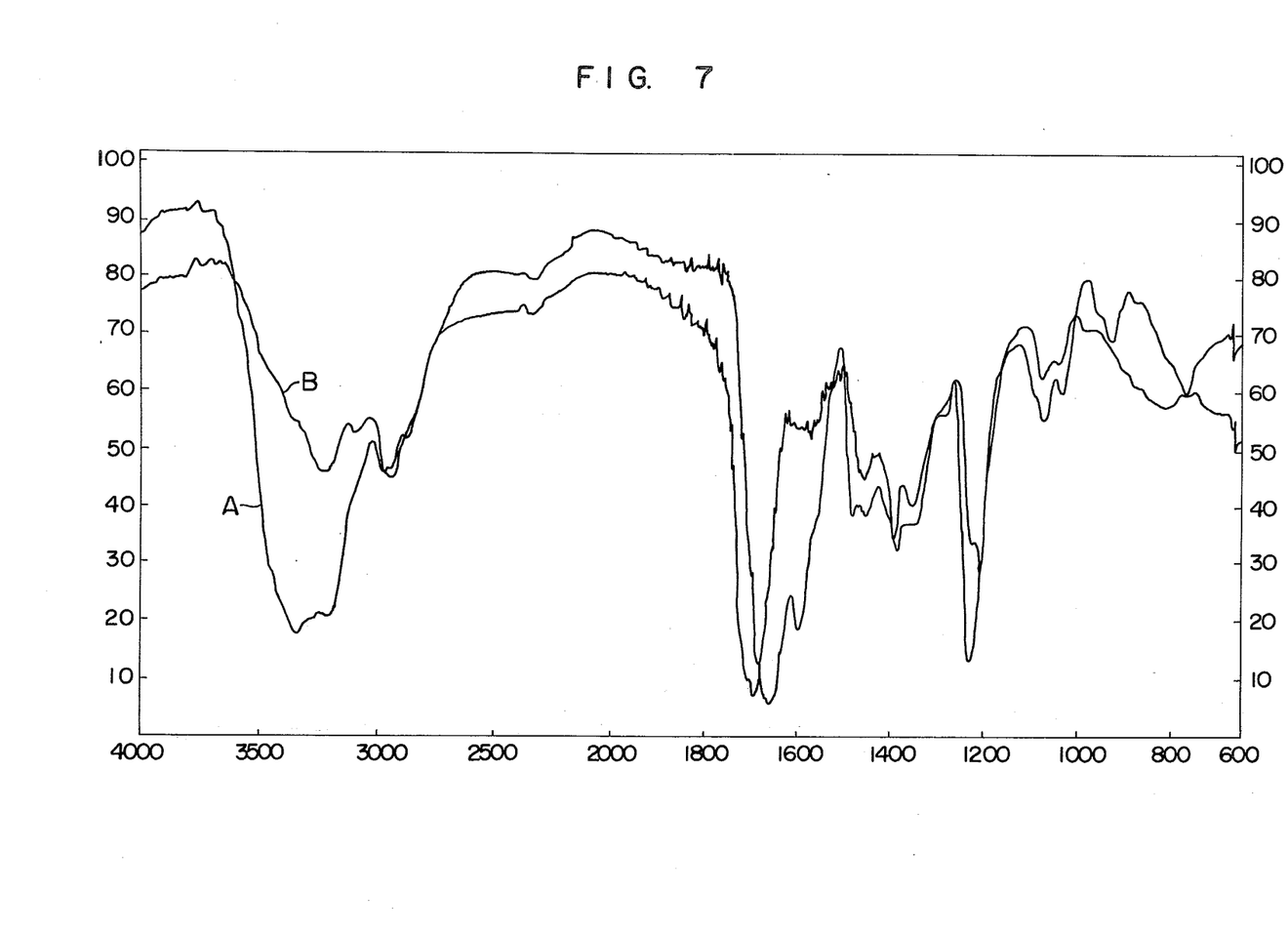
FIG. 7 shows the infrared absorption spectra of a PMAA polymer and an imide-formed PMAA.

The infrared absorption spectrum of the imide-formed PMAA according to this invention is shown in FIG. 7 together with the similar spectrum of PMAA. In the figure, A indicates the infrared absorption spectrum of PMAA and B indicates that of the imide-fomred PMAA. There are noted a change originating from stretching of NH and a change in absorption caused by As understood from the above-described characteristic behavior of PMAA relative to heat, the imide-formed PMAA resist material of this invention can be produced by heating PMAA at a temperature of about 180° to 270° C. for a period of about 10 to 30 minutes. As the reaction can be advanced such that the C/N atomic ratio will be confined within the defined range of more than 4 and up to 6 by properly selecting the heating temperature and heating time, there can be easily obtained an imide-formed PMAA resist material with C/N ratio of more than 4 and up to 6 as intended in this invention.

Figure 1:
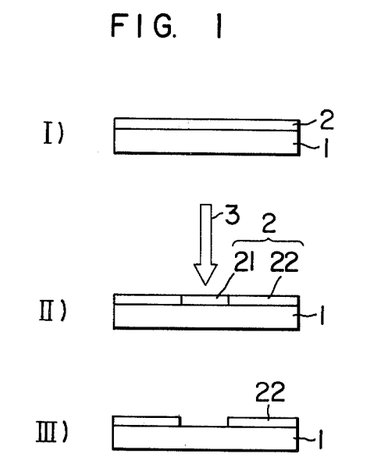
FIG. 1 shows the etching process, advanced successively from (I) to (II) to (III), as practiced by using a resist material according to this invention.

The imide-formed PMAA resist material of this invention, which is provided as a continuous thin film 2 on a substrate 1, is exposed to, for example, electron beams in vacuo according to a normal method to form thereon a latent image of an etching pattern. In FIG. 1, exposure is indicated by numeral 3, the exposed portion of the resist film by numeral 21 and the non-exposed portion by numeral 22. For forming the etching pattern latent image, the resist film 2 may be scanned successively with the radiation which has been modulated in correspondence to the pattern signal, or the resist film may be scanned successively with the radiation of a predetermined intensity by using a as mask a radiation shield plate having an etching pattern.

The required incident charge of radiation, although varying depending on the degree of the imide conversion reaction and the kind of the developing solution used, is usually within the range of $2 \times 10^{-7}$ to $1 \times 10^{-3}$ coulomb/cm² (accelerating voltage: 10 KV) in the case of electron beams and 10.0 to 50,000 J/cm³ in the case of far-ultraviolet rays or X-rays. The conventional positive type resists are changed from positive into negative type as the incident charge of the electron beams increases, but the resist of this invention suffers no such change even if the incident charge of radiation increases.

The latent image of the etching pattern formed by exposure to radiation is developed by washing the resist film with a solvent and dissolving away the exposed portion. The solvent used as the developing solution is water or an aqueous alkaline solution. As a result of washing with the developing solution, there remains the non-exposed portion 22 alone in FIG. 2 ((III) in FIG. 1). The developing treatment may be accomplished by merely immersing the resist film in the solvent, but for obtaining a minute pattern with high precision, it is desirable to spray the solvent over the film surface so that the latter is always contacted with fresh developing solution.

The developing time varies depending on the degree of the imide conversion reaction, the incident charge of radiation and the kind of solvent used. Increase of the C/N ratio makes the resist film hard to dissolve, while increase of the incident charge makes the exposed portion easy to dissolve. Also, rise of temperature and pH of the solution makes the resist film easy to dissolve. Therefore, these factors are suitably selected by taking account of the difference in dissolution of the exposed and non-exposed portions. For instance, in the case of using a material which has undergone a 15-minute imide conversion reaction at 200° C. resulting in C/N = 4.09, about 10-minute development with water at 20° C. can provide an etching pattern with high resolution and high quality. In other words, an excellent etching pattern can be obtained from 9-minute development with water on a resist film which has undergone 15-minute imide conversion prebaking at 200° C. and which has formed thereon the etching pattern latent image by exposure to $5 \times 10^{-6}$ C/cm² electron beams or 250 J/cm³ far-ultraviolet rays or X-rays. It should be noted however that a too long developing time results in an excess undercut originating from back reflection of radiation.

Figure 4:
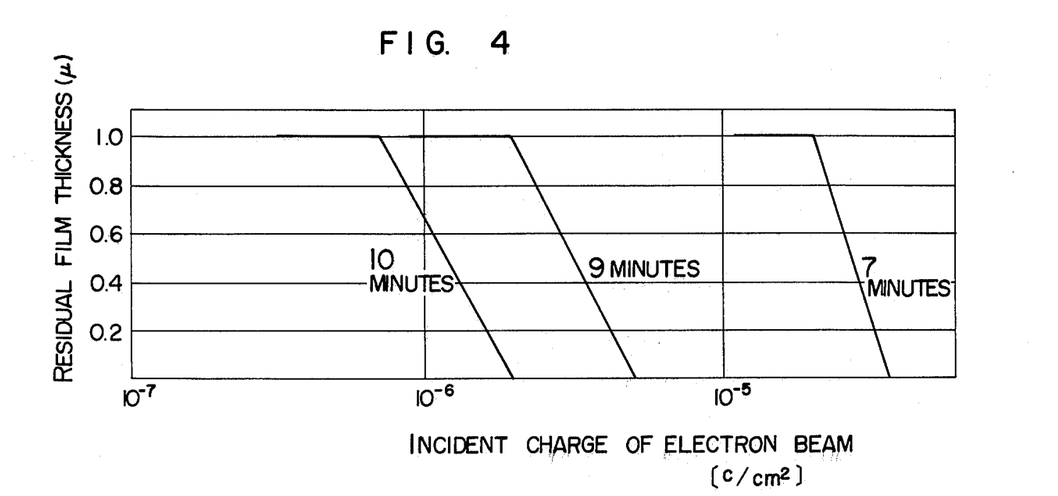
FIG. 4 shows the change of residual film thickness with changes of electron beam incident charge and developing time in development with water.

FIG. 4 shows the change of the residual film thickness of the resist film after completion of development on the resist film exposed to electron beams, with relation to the changes of incident charge of electron beams and developing time. As noted from this figure, the developing time is shortened as the incident charge of electron beams increases. The results given in FIG. 4 are those obtained by performing development with water at 20° C.

An aqueous alkaline solution having a pH of about 8 to 12 can be used as a favorable developing solution as use of such solution can shorten the developing time.

Figure 5:
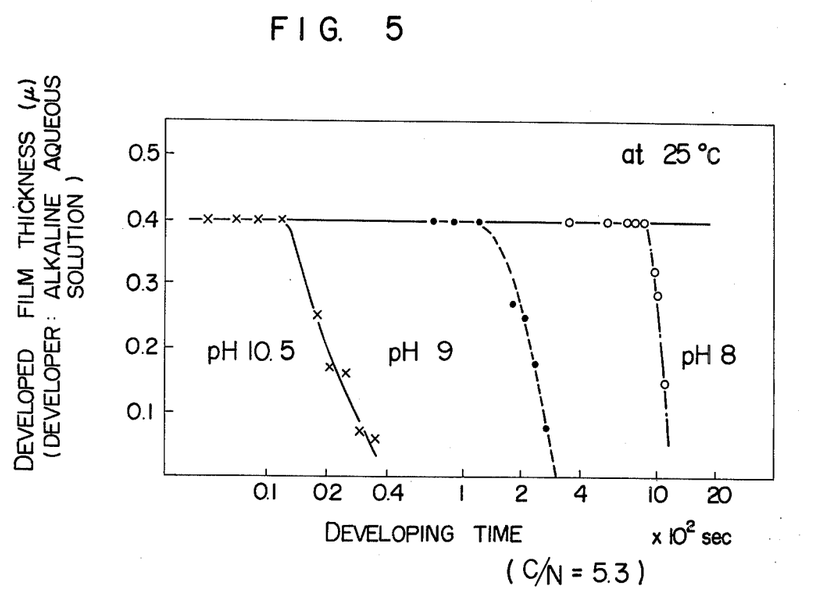
FIG. 5 shows the change of developed film thickness with changes of pH and developing time in case of using an alkaline solution as developer.

FIG. 5 is a graphic representation of the relationship between pH of the developing solution and developing time. As noticed from this figure, the developing time can be shortened by elevating the pH of the developing solution. In the case of using cold water as the developing solution, it is hardly possible to use the PMAA in which the imide conversion (C/N ratio) has advanced in excess of 4.2 in the prebaking, but in the case of using an alkaline solution as the developing solution, it is possible to employ the PMAA in which the imide conversion rate has advanced to 6 or even higher by prebaking or polymerization. It is to be noted that the higher the imide conversion rate of the resist film, the higher the thermal stability of the film.

The aqueous alkaline solution used as developing solution in this invention may be an aqueous solution of sodium methasilicate, potassium hydroxide, sodium carbonate, sodium acetate, sodium oxalate, monoethanolamine, diethanolamine or triethanolamine or ammonia water, and these solutions are used with a pH of from 7 to 12. Among these solutions, the aqueous solution of sodium methasilicate or diethanolamine is most preferred.

The developed etching pattern is subjected to a drying step. If the resist film is dried immediately after development, there may slightly remain resist material on the exposed substrate surface. Therefore, drying is performed after washing the resist film with an organic solvent which has compatibility with water (developing solution) and which does not dissolve the imide-formed PMAA (resist material), such as for example methyl alcohol, ethyl alcohol, propyl alcohol and butyl alcohol.

Finally, the resist film remaining on the substrate in accordance with the etching pattern thereon is subjected to an additional imide conversion treatment to make the film insoluble in various kinds of solvents and etching solutions and also make it stable to heat. Imide conversion of the resist film 22 can be accomplished by a heat treatment or by immersing the film in acid such as tannic acid and then drying the same. As the imide conversion reaction in the resist film advances, the resist film is changed in color from white into yellow.

Described above are the method of producing a resist material according to this invention and the method of forming an etching pattern by using an imide-formed PMAA. The imide-formed PMAA copolymers of this invention can be also similarly prepared from copolymers of methacrylamide and other vinyl monomers. The properties of these resist materials are shown in Table 1 below.

Table 1

Properties of polymethacrylamide copolymers as used as resist material

| Comonomers | Properties as resist material |
|---|---|
| Acrolein | Adhesion to $SiO_2$ is bettered when incident charge of electron beams is less than $10^{-6}$ coulomb/$cm^2$. |
| Acrylonitrile | 10% higher in sensitivity than homopolymers, but there is a trailing portion in the sensitivity curve. |
| Methacrylic acid | A sharp edge is provided if the copolymerization rate is around 5%. |
| Acrylic ester | Negative type is made when the copolymerization rate is over 10%, but the prebaking temperature can be lowered to 180° C. |
| Methacrylic ester | Sensitivity is almost unchanged, but the edge gets slightly blunted. |
| Acrylamide | The temperature at which imide conversion begins is 160° C, which is lower than that when PMAA alone is used. |
| Barium or lead salt of acrylic acid | Sensitivity to X-rays is improved. |
| Vinyl isothiocyanate | This monomer is toxic, but the sensitivity is improved 20% over the case of using PMAA alone. |
| Styrene | Good adhesion to the substrate is provided. |

The invention is illustrated with reference to Examples presented below, but the invention is not limited to the examples.

EXAMPLE 1

A 0.08 μm thick chromium evaporated film was formed on a glass substrate and then a 6% by weight methacrylamide aqueous solution was applied on said film by a spin-coater (manufactured by Headway Co., Ltd.). 15-second coating with an 80 cP solution at a head spinning speed of 4,000 r.p.m. formed an about 0.7 μm thick coating film. This coating film, after air-drying, was subjected to prebaking at 200° C. for 15 minutes. This prebaking completed drying of the coating film and advanced the partial imide conversion reaction. The C/N ratio of the thus treated film was about 4.09.

When the substrate temperature dropped to room temperature, the work was put into an electron beam irradiater and exposed to electron beams at an incident charge of approximately $5 \times 10^{-6}$ C/$cm^2$ to form a latent image on the substrate. The accelerating voltage applied was 15 KV, and aluminum was used as target.

After exposure, the work was immersed in 20° C. water for 9 minutes to develop the image, immediately followed by rinsing in isopropyl alcohol. Additional 15-minute heating at 200° C. further advanced imide conversion to provide a solid resist film.

When this resist film was scanned by 1,000 Å wide electron beams with beam current of $10^{-9}$ A to form a mask, the line width of the groove was 2,000 Å.

Chromium was sputter-etched by using this resist mask under the following sputtering conditions: frequency, 13.56 MHz; 0.2 W; period, 180 seconds.

Sputter etching could be accomplished favorably. Washing with a warm alkaline aqueous solution (pH: 11) after sputtering removed the imide-formed PMAA film from the chromium surface. The chromium film at the exposed portion disappeared, indicating that PMAA had served as a good etching mask.

EXAMPLE 2

The same resist film as formed in Example 1 was treated in the same way as described above except for exposure to ultraviolet rays (200–260 mμ) or X-rays an incident charge of 250 J/$cm^3$, obtaining similar results to those of the preceding example.

EXAMPLE 3

A 7% by weight aqueous solution of a PMAA copolymer obtained by copolymerizing methacrylamide with 2 mol% of barium acrylate was spin-coated on the gold-evaporated surface of a glass substrate. As the polymerization degree of this copolymer is somewhat lower than that when using PMAA alone, the solution viscosity is naturally lower at the same concentration. Spin-coating with a 40 cP solution at a head spinning speed of 4,000 r.p.m. produced a coating film with a thickness of about 0.6 μm. After air-drying, it was subjected to 15-minute prebaking at 200° C. to bring about a C/N ratio of approximately 4.2. When the substrate temperature dropped to room temperature, the work was put into an electron beam exposure system and exposed at an incident charge of around $7 \times 10^{-6}$ C/$cm^2$ while applying an accelerating voltage of 15 KV.

After exposure, the work was developed by immersing it in water of 20° C. for 4 minutes, immediately followed by washing with isopropyl alcohol.

Further 15-minute immersion in a 10% by weight tannic acid solution caused imide conversion and hardening of the surface film. Additional washing with water and drying provided an excellent resist mask.

Gold on the substrate was etched by using this resist mask with an etching solution prepared by dissolving 20 gr of KI and 5 gr of $I_2$ in 250 ml of water. Gold was etched to the depth of 0.3 μm by about 30-second treatment. The finished film formed a good edge, indicating excellent availability of the used imide-formed PMAA copolymer as a good etching mask.

EXAMPLE 4

The process of Example 3 was repeated but by using 14 J/$cm^3$ charge of X-rays instead of electron beams, obtaining similar result to that of Example 3.

EXAMPLE 5

A mask was formed by the same treatment as Example 1 except for use of a glass substrate evaporated on its surface with an about 200 Å thick chromium layer. The resist layer was 4,000 to 5,000 Å thick (C/N ratio =

6.0). Chromium was evaporated to the thickness of about 1,000 Å over the entire surface of said layer. Then the work was subjected to supersonic washing with a weak alkaline solution to remove the resist layer and the chromium layer on the resist.

The work was then subjected a 40-second etching with an etching solution prepared by mixing 1 part by weight of a solution of 50 gr NaOH dissolved in 100 ml of water and 3 parts by weight of a solution of 100 gr $K_3[Fe(CN)_6]$ dissolved in 300 ml of water, whereby the 200 Å thick chromium layer staying below the resist layer was removed. On the glass substrate, a 700 to 800 Å thick chromium layer was formed at the portion exposed to electron beams. This indicates that the so-called lift-off process has been accomplished.

EXAMPLE 6

The same process as Example 1 was followed except that electron beams with incident charges shown in the table below were applied to the resist film which had undergone 1-hour heating at 240° C. to attain the C/N ratio of 5, thereby forming three kinds of latent images, and these latent images were developed with an aqueous solution of sodium methasilicate. The developing time required was as shown in the following table.

| Electron beam incident charge (C/cm$^2$) | Developing time |
|---|---|
| $3.8 \times 10^{-7}$ | 2 min. |
| $2.5 \times 10^{-7}$ | 3 |
| $1.3 \times 10^{-7}$ | 4 |

EXAMPLE 7

A PMAA copolymer obtained by copolymerizing methacrylamide with 5 mol% (based on methacrylamide) of styrene was dissolved in hot water to prepare a 4% solution, and this solution was applied on a silicon substrate by a spinner rotating at the speed of 2,000 r.p.m. Upon drying, there was obtained a 4,000 Å thick film, and this film was subjected to 20-minute heating at 205° C. to form a film of the imide-formed PMAA copolymer with C/N ratio of 4.4.

A homopolymer solution of methacrylamide can not provide a good coating film for a water-repellent substrate such as silicon, but a copolymer of methacrylamide and styrene provides an excellent coating film.

Said film was then exposed to ultraviolet rays for 10 minutes through a mask having a pattern drawn by silicon on a quartz substrate by using a 200 W deuterium lamp emitting light of 2,000 to 2,600 Å, thereby forming a latent image of the pattern, and this latent image was developed with a weak alkaline solution with pH 9 for 3 minutes and then washed with 2-propanol to form an etching mask. The silicon substrate carrying said mask on its surface was put into a plasma etching apparatus and subjected to 5-minute etching therein, whereby the silicon substrate was etched to a depth of 4,000 Å. This was followed by supersonic washing in an alkaline solution with pH 10 to 11 to strip off the resist layer. The result showed that excellent dry etching of silicon had been accomplished.

As described above, there is provided according to the present invention an excellent resist having sensitivity to radiation such as electron beams, X-rays and ultraviolet rays.

What is claimed is:

1. A resist material capable of forming a positive image by application of radiation, said material comprising a crosslinked polymer including the following structural units:

and having a C/N atomic ratio within the range of more than 4 and up to 6, or a copolymer thereof with another vinyl monomer, said copolymer containing the vinyl monomer units in an amount of up to 10 mol%.

2. The resist material set forth in claim 1, said material being provided in the form of a film on a substrate to be etched which is made of a material selected from the group consisting of semi-conductors, metals and metal oxides.

3. The resist material set forth in claim 1, wherein the vinyl monomer is a member selected from the group consisting of acrolein, acrylonitrile, methacrylic acid, lower alkyl esters of acrylic acid, acrylamide, metal salts of acrylic acid, vinyl isothiocyanate and styrene.

4. The resist material set forth in claim 1, wherein the average molecular weight of the polymer or copolymer is within the range of 50,000 to 5,000,000.

5. The resist material set forth in claim 1, wherein the C/N atomic ratio is within the range of 4.09 to 6.0.

6. A method of making a positive resist image comprising the steps of forming on a substrate to be etched a film of a resist material composed of a crosslinked polymer including the following structural units:

and having a C/N atomic ratio within the range of more than 4 and up to 6, or a copolymer thereof with another vinyl monomer, said copolymer containing the vinyl monomer units in an amount of up to 10 mol%, exposing said film to radiation through a predetermined pattern to form a latent image, and then dissolving away the exposed portion with a solvent.

7. The method according to claim 6, wherein the substrate to be etched is made of semiconductor or a metal.

8. The method according to claim 6, wherein the other vinyl monomer is a member selected from the group consisting of acrolein, acrylonitrile, methacrylic acid, lower alkyl esters of acrylic acid, lower alkyl esters of methacrylic acid, acrylamide, metal salts of acrylic acid and vinyl isothiocyanate esters.

9. The method according to claim 6, wherein the radiation used is electron beams.

10. The method according to claim 6, wherein the solvent used for development is water or an aqueous alkaline solution with a pH of about 8 to about 12.

11. The method according to claim 6, wherein the formed positive resist image is washed with a solvent selected from the group consisting of methyl alcohol, ethyl alcohol and propyl alcohol.

12. The method according to claim 6, wherein the formed positive resist image is further subjected to an imide conversion reaction.

13. The method according to claim 6, wherein the radiation used for irradiation is far-ultraviolet rays or X-rays.

14. The method according to claim 13, wherein the alkaline solution used as solvent is an aqueous solution of a substance selected from the group consisting of sodium methasilicate, sodium hydroxide, potassium hydroxide, sodium carbonate, sodium acetate, sodium oxalate, monoethanolamine, diethanolamine and triethanolamine.

15. The method according to claim 14, wherein the imide conversion reaction is accomplished by heating.

16. The method according to claim 14, wherein the imide conversion reaction is accomplished by tannic acid treatment.

17. The method according to claim 6, wherein the formation of the film is accomplished by heating an aqueous solution of poly(methacrylamide) or a polymethacrylamide copolymer containing other vinyl monomer units in an amount of up to 10 mol%, thereby converting said poly(methacrylamide) or polymethacrylamide copolymer into a crosslinked polymer including the following structural units:

and having a C/N atomic ratio within the range of more than 4 and up to 6, or a copolymer thereof with another vinyl monomer, said copolymer containing the vinyl monomer units in an amount of up to 10 mol%, and coating the substrate with an aqueous solution of the converted polymer or copolymer.

18. The method according to claim 17, wherein heating is performed at a temperature of 70° to 100° C. in aqueous solution.

19. The method according to claim 6, wherein the formation of the film is accomplished by first forming on a substrate to be etched a film of poly(methacrylamide) or a polymethacrylamide copolymer containing other vinyl monomer units in an amount of up to 10 mol%, and then heating said film to convert said poly(methacrylamide) or polymethacryamide copolymer into a crosslinked polymer including the following structural units:

and having a C/N atomic ratio within the range of more than 4 and up to 6, or a copolymer thereof with another vinyl monomer, said copolymer containing the vinyl monomer units in an amount of up to 10 mol%.

20. The method according to claim 19, wherein the average molecular weight of poly(methacrylamide) or its copolymer is within the range of 50,000 to 5,000,000.

21. The method according to claim 19, wherein heating is performed until the C/N ratio of the said produced polymer is within the range of 4.09 to 6.0.

22. The method according to claim 19, wherein heating is performed at a temperature of 180° to 270° C.

23. The method according to claim 22, wherein the incident charge of the electron beams is within the range of $2 \times 10^{-7}$ to $1 \times 10^{-3}$ coulomb/cm$^2$.

24. The method according to claim 22, wherein the incident charge of far-ultraviolet rays or X-rays is within the range of 10.0 to 50,000 J/cm$^3$.

* * * * *